United States Patent

Shiota

[11] Patent Number: 6,101,709
[45] Date of Patent: Aug. 15, 2000

[54] EQUIPMENT AND METHOD FOR MOUNTING ELECTRONIC COMPONENTS

[75] Inventor: Takayuki Shiota, Kurume, Japan

[73] Assignee: Matsushita Electric Industrial Co., Ltd., Osaka, Japan

[21] Appl. No.: 09/130,020

[22] Filed: Aug. 6, 1998

[30] Foreign Application Priority Data

Aug. 7, 1997 [JP] Japan ................................. 9-212811

[51] Int. Cl.7 .................................................. H05K 3/30
[52] U.S. Cl. ............................. 29/833; 29/740; 29/741; 29/755; 29/759; 29/832
[58] Field of Search .......................... 29/755, 740, 833, 29/832, 739, 741, 759

[56] References Cited

U.S. PATENT DOCUMENTS

| | | | |
|---|---|---|---|
| 5,007,162 | 4/1991 | Weeber | 29/740 X |
| 5,040,291 | 8/1991 | Janisiewicz et al. | 29/740 X |
| 5,456,001 | 10/1995 | Mori et al. | 29/740 X |
| 5,491,888 | 2/1996 | Sakurai et al. | 29/740 X |
| 5,566,447 | 10/1996 | Sakurai | 29/740 X |
| 5,743,005 | 4/1998 | Nakao et al. | 29/833 |
| 5,864,944 | 2/1999 | Kashiwagi et al. | 29/740 X |
| 5,894,657 | 4/1999 | Kanayama et al. | 29/740 |

FOREIGN PATENT DOCUMENTS

| | | | |
|---|---|---|---|
| 3-289197 | 12/1991 | Japan . | |
| 4-94199 | 3/1992 | Japan . | |
| 4-364099 | 12/1992 | Japan | 29/833 |
| 5-267896 | 10/1993 | Japan | 29/740 |
| 5-335793 | 12/1993 | Japan | 29/833 |

*Primary Examiner*—Carl J. Arbes
*Attorney, Agent, or Firm*—Wenderoth, Lind & Ponack, L.L.P.

[57] ABSTRACT

An apparatus for mounting electronic components includes a moving rail for moving a substrate back and forth, a plurality of part feeders disposed along a side of the moving rail, a plurality of transfer head guide rails installed in a direction orthogonal to a moving direction of the substrate along the moving rail, and a plurality of transfer heads fitted to each of the transfer head guide rails for picking up, transferring and mounting onto the substrate the electronic components from the part feeders while moving along the transfer head guide rails. In a method of mounting electronic components, the electronic components are picked up from part feeders disposed along a side of the moving rail by a nozzle of the transfer head which moves along the transfer head guide rail disposed orthogonally to the moving rail, transferred and loaded onto a substrate while the substrate is moved along the moving rail. This method of mounting electronic components is characterized by determining an X coordinate position for loading the electronic parts based upon a magnitude of movement of the substrate carried by the moving rail, and by determining a Y coordinate position based upon a magnitude of movement of the transfer head moved along the transfer head guide rail.

17 Claims, 11 Drawing Sheets

EQUIPMENT AND METHOD FOR MOUNTING ELECTRONIC COMPONENTS

FIELD OF THE INVENTION

The present invention relates to an apparatus and a method for mounting electronic components of numerous kinds on a substrate at high speed.

BACKGROUND OF THE INVENTION

Equipment for mounting electronic components is generally classified into two categories, a rotary-head type apparatus (hereinafter cited as "rotary-head type") as described in Japanese Patent Laid-Open Publication No. H04-94199, etc., and an X-Y table type apparatus (hereinafter cited as "X-Y table type") as described in Japanese Patent Laid-Open Publication No. H03-289197, etc.

The rotary-head type is characterized most by a high-speed operation as it loads electronic components in a part feeder onto a substrate on an X-Y table successively while rotating a plurality of transfer heads around a rotary head. The X-Y table type mounts electronic parts in a part feeder onto a substrate while moving a transfer head horizontally in X and Y directions, and it has such advantages that it can mount electronic components of various kinds in a wide variety of shapes and dimensions onto the substrate, and that its structure is simpler and less costly than the rotary-head type. However, the X-Y table type suffers from low productivity since its mounting speed is considerably slower than the rotary-head type.

On the other hand, because the rotary-head type drives the transfer head to move up and down while rotating it around the rotary head and the part feeder to repeat a movement at high speed toward a predetermined pick-up location, it has many problems such as excessive vibration and noise in the entire apparatus, being liable to repeat mounting errors, e.g., pick-up errors and loading errors of the electronic components, and an intricacy of the structure, thereby making the apparatus costly and requiring much labor for its maintenance.

Accordingly, an object of the present invention is to provide equipment and a method for mounting electronic components at high speed with high reliability so as to obviate the problems of the rotary-head type apparatus and the X-Y table type apparatus.

SUMMARY OF THE INVENTION

A method of mounting electronic components and an apparatus for implementing the method are providing according to the present invention. The apparatus comprises a moving rail for moving a substrate back and forth, a plurality of part feeders disposed along a side of the moving rail, a plurality of transfer head guide rails installed in a direction orthogonal to a moving direction of the substrate on the moving rail, and a plurality of transfer heads fitted to each of the transfer head guide rails for picking up, transferring and mounting onto the substrate the electronic components from the part feeders while moving along the transfer head guide rails, wherein the moving rail repeatedly moves the substrate forward and backward rectilinearly and the transfer heads load the electronic components onto the substrate at high speed as they move rectilinearly between the part feeder and the substrate in a direction orthogonal to the moving rail.

DESCRIPTION OF THE PREFERRED EMBODIMENTS

First Exemplary Embodiment

Figure 1:
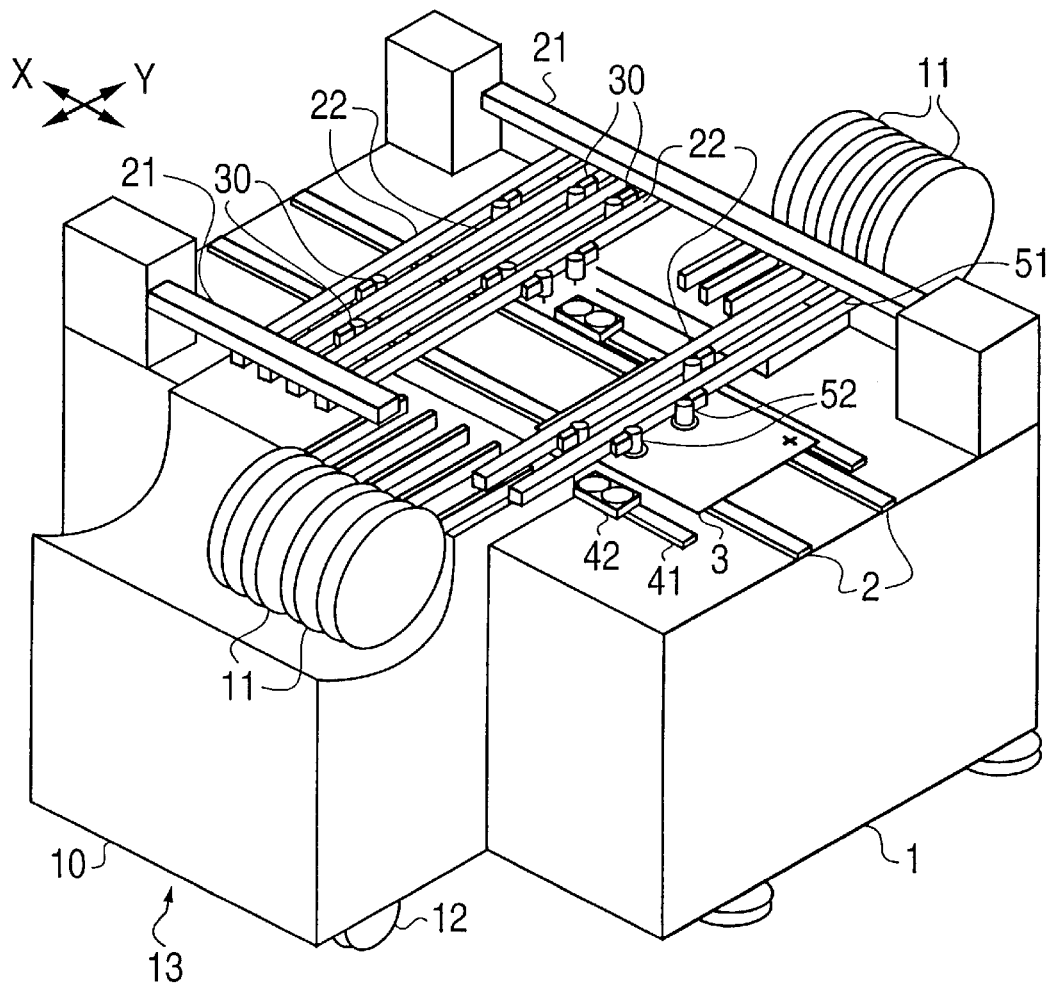
FIG. 1 is a perspective view of equipment for mounting electronic components according to a first embodiment of the present invention.

Firstly, a structure of an apparatus for mounting electronic components of a first embodiment of this invention is described below by referring to FIG. 1 through FIG. 6. In FIG. 1, a pair of moving rails 2 in the form of a moving rail track is mounted on a top center surface of a base 1. The moving rails 2 comprise a driving means, such as a linear motor and a feed screw, for moving a substrate 3 placed upon them rectilinearly in forward and backward directions.

The base 1 is provided with trucks 10 at both sides. Each of the trucks 10 is provided with a plurality of part feeders 11 that are aligned in parallel with the moving direction of the substrate 3 along the moving rails 2. The part feeder 11 is constituted by a tape feeder. In describing the invention, the moving direction of the substrate 3 along the moving rails 2 defines an X direction and a direction orthogonal thereto defines a Y direction. That is, a number of the part feeders 11 are aligned in the X direction. The truck 10 is equipped with casters 12 for mobility on a floor. The truck 10 provided with the part feeders 11 as a whole comprises an electronic component supply unit 13.

A transfer head structure is described next. Arms 21 are provided above the base 1 in parallel with the moving rails 2. The two arms 21 are positioned in a manner to place the moving rails 2 therebetween, and a plurality of transfer head guide rails 22 in the form of rail tracks are installed on the arms 21. The transfer head guide rails 22 are spaced along the X direction with their longitudinal sides extending along a direction (Y direction) orthogonal to the moving direction X of the moving rails 2. Each of the transfer head guide rails 22 is equipped with at least one transfer head 30 (two sets in the example of this embodiment). For convenience of illustration in FIG. 1, portions of the arms 21 and the guide rails 22 are either cut off or omitted.

Figure 2:
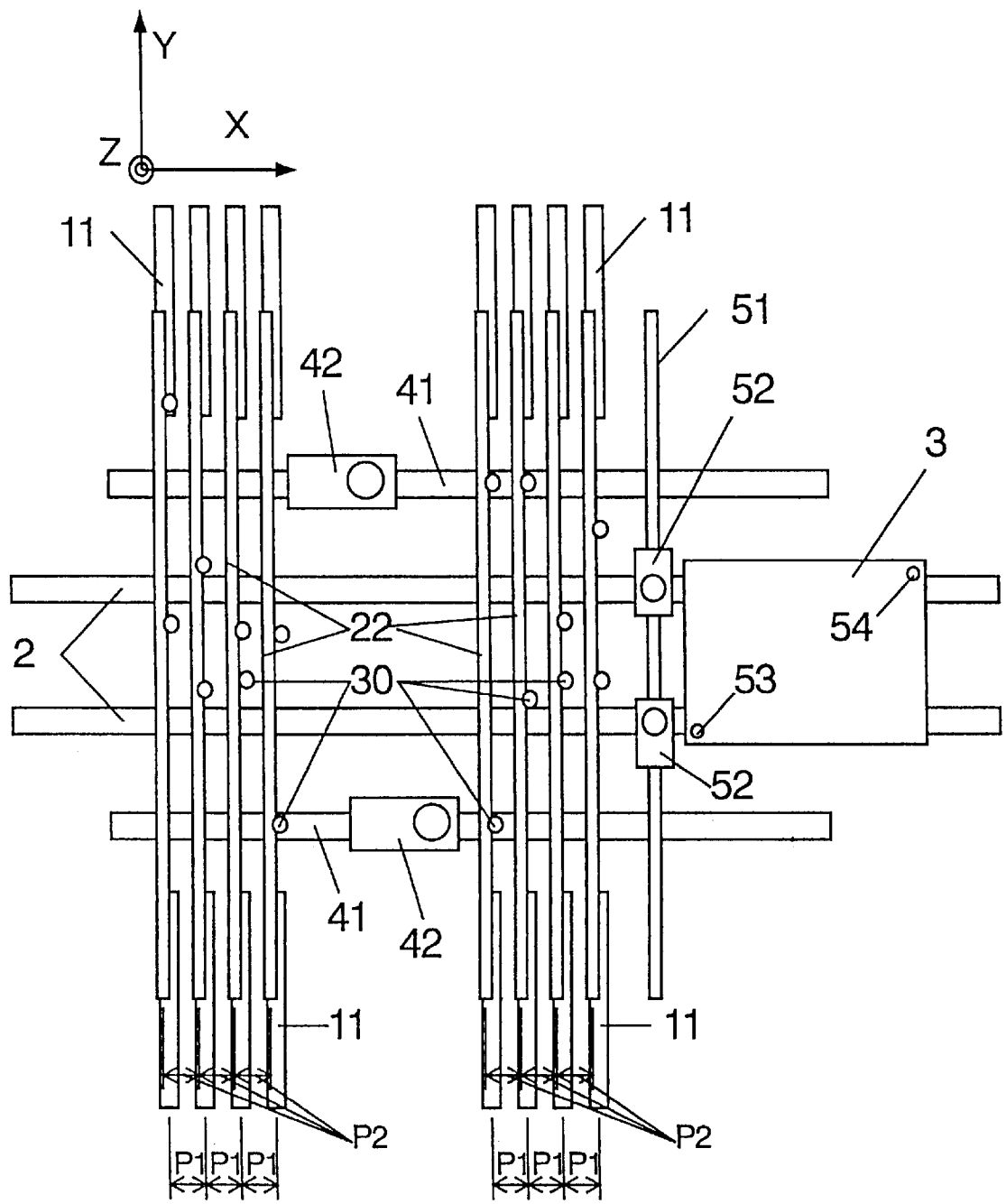
FIG. 2 is a top view of the equipment.
Figure 3:
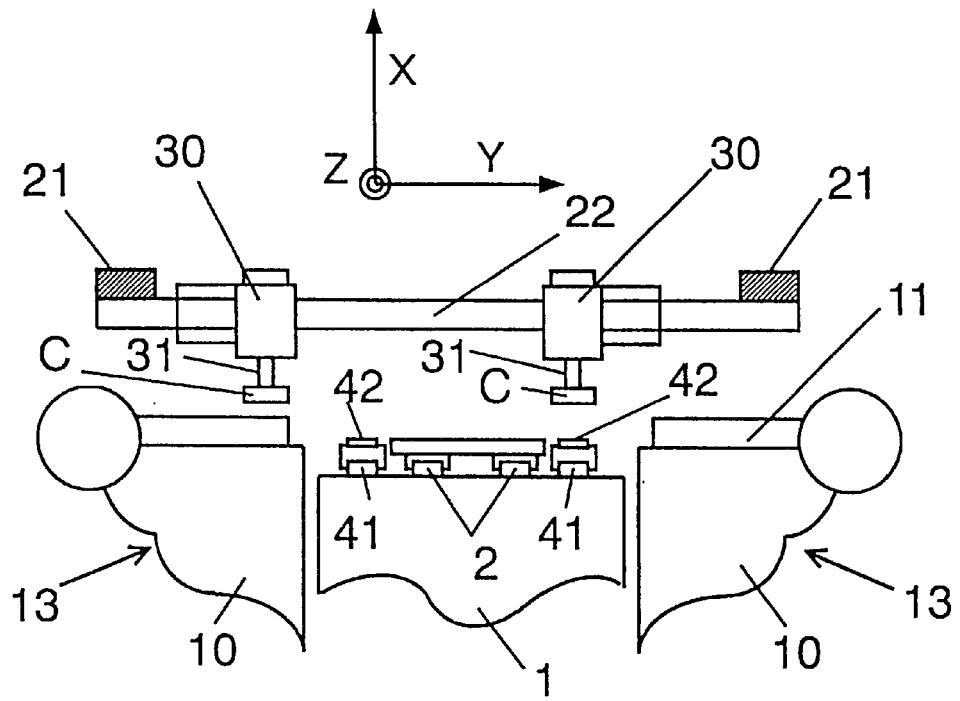
FIG. 3 is a front view of the equipment.
Figure 4:
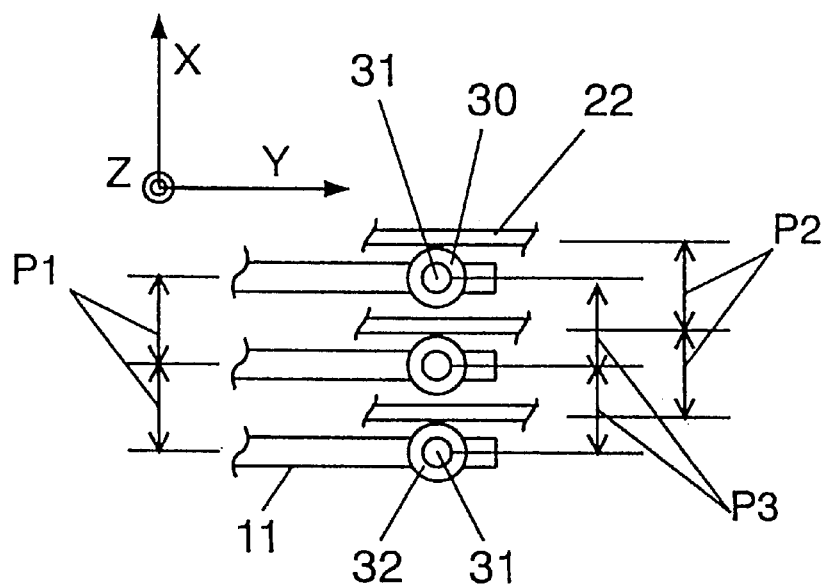
FIG. 4 is an enlarged top view of a portion of the equipment.

In FIGS. 2, 3 and 4, a pitch P1 of the part feeders 11 (and thus of the pick-up positions of electronic parts in the part feeders 11) and a pitch P2 of the transfer head guide rails 22 are made equal. A pitch P3 of nozzles 31 on the transfer heads 30, equipped on each of the adjoining transfer head guide rails 22 along the moving direction (X direction) of substrate 3 by the moving rails 2, is also equal to the pitch P1 of the pick-up positions of the electronic parts in the part feeders 11.

The transfer head guide rail 22 and the transfer head 30 together compose a linear motor, and the transfer head 30 moves between the part feeder 11 and the substrate 3 along the transfer head guide rail 22 in the Y direction that is orthogonal to the moving direction (X direction) of the substrate 3 along the moving rails 2. There are other means, such as a feed screw mechanism, besides the linear motor for moving the transfer head 30 along the transfer head guide rail 22, but illustration and description thereof are omitted here as they are well known in the art.

Figure 5:
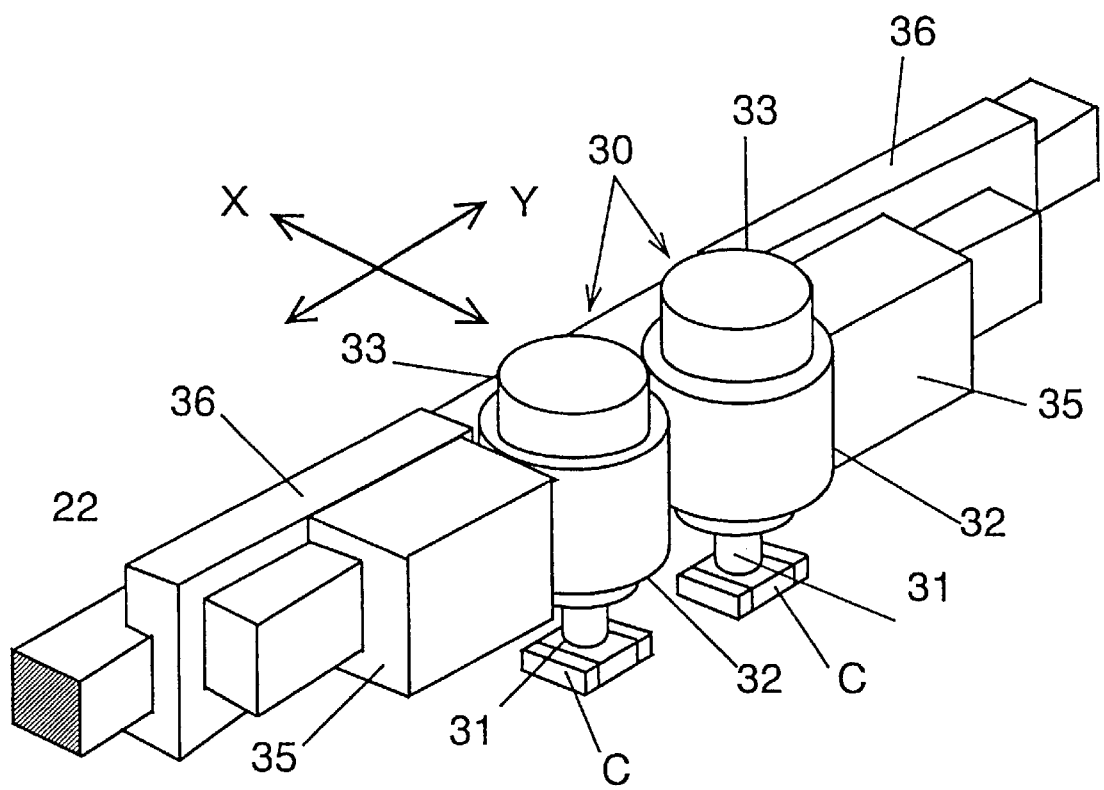
FIG. 5 is a perspective view of a transfer head of the equipment.

In FIG. 5, the transfer head 30 comprises the nozzle 31 for vacuum-suction of the electronic components C stored in the part feeder 11 (in FIG. 3), a vertical shifting means 32 for moving the nozzle 31 up and down, a rotating means 33 for rotating the nozzle 31 about its axis and a driving unit 35 for driving them. A back of the driving unit 35 is attached to a slider 36 which in turn is slidably mounted to the transfer head guide rail 22 so as to allow it to slide freely. The two transfer heads 30 shown side by side in FIG. 5 are freely movable in the Y direction along the transfer head guide rail 22 independently from each other.

A means for discerning the electronic components is now described. In FIGS. 1, 2 and 3, a first camera guide rail 41 is placed between the moving rail 2 and the part feeder 11 in parallel with the moving rail 2. A first camera 42 moves along the first camera guide rail 41 in the X direction. A linear motor or a feed screw mechanism may be used as a moving mechanism for moving the first camera 42. The first camera 42 discerns the electronic component C that is held by suction at a bottom end of the nozzle 31 from an underside of it.

A second camera guide rail 51 is installed in parallel with and at the same height as the transfer head guide rail 22 as shown in FIGS. 1 and 2. Two second cameras 52 are mounted on the second camera guide rail 51. While moving along the second camera guide rail 51 in the Y direction, each of the two second cameras 52 individually discerns two positional identification marks, an A spot 53 and a B spot 54, on the substrate 3 being carried on the moving rail 2. A linear motor or a feed screw mechanism may be used as a moving structure for moving each of the second cameras 52. A precise position of the substrate 3 is obtained as a consequence of recognizing the A spot 53 and the B spot 54 since they are marked on a diagonal line of an upper surface of the substrate 3.

Figure 6:
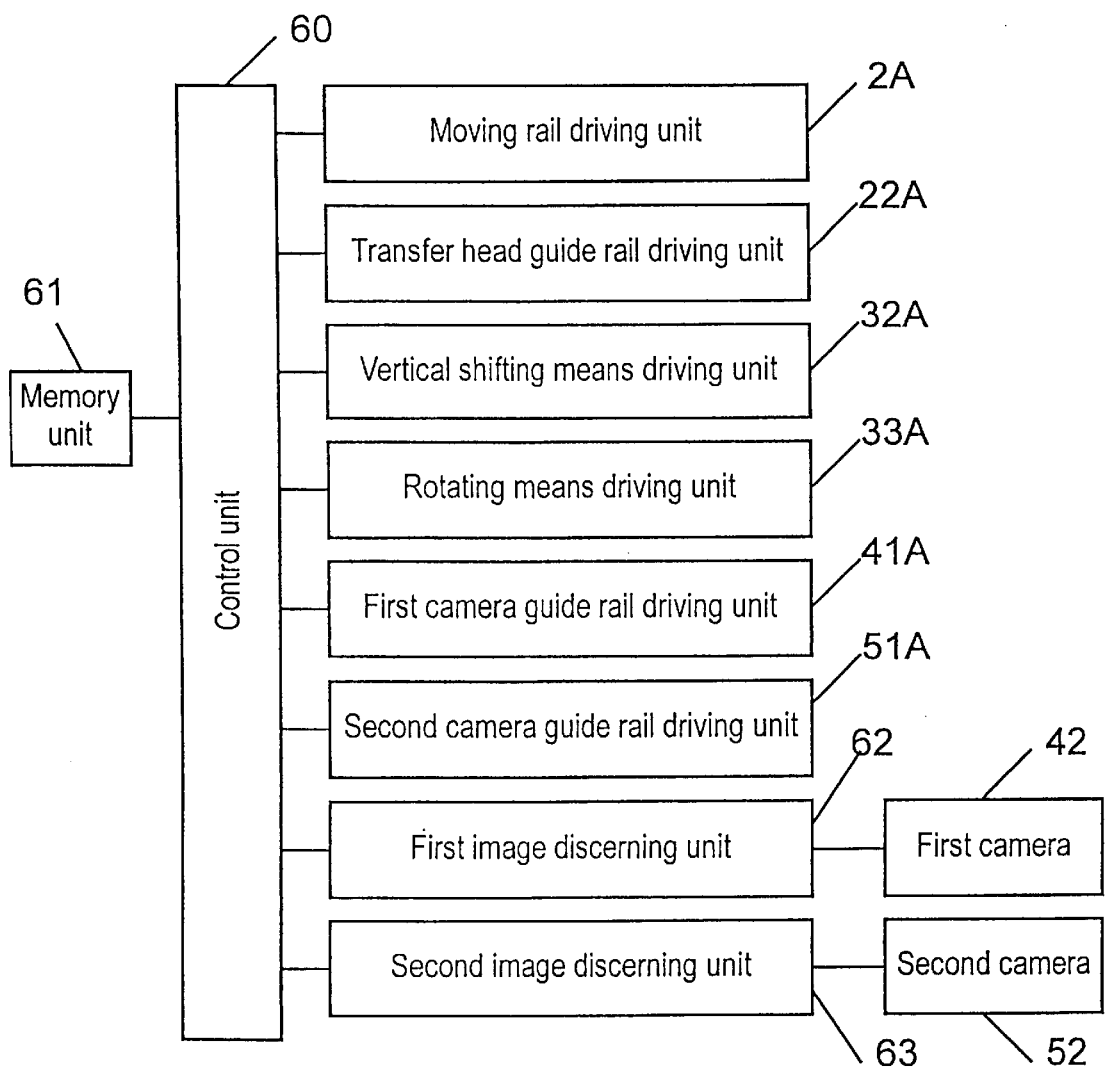
FIG. 6 is a block diagram of a control system for the equipment.

Next, a control system is described by referring to FIG. 6. A control unit 60 is connected with elemental components as described hereinafter. A memory unit 61 stores data such as loading data for the electronic components, program data, etc. A moving rail driving unit 2A, a transfer head guide rail driving unit 22A, a vertical shifting means driving unit 32A, a rotating means driving unit 33A, a first camera guide rail driving unit 41A and a second camera guide rail driving unit 51A individually control movement via the moving rails 2, the transfer head guide rails 22, the vertical shifting means 32, the rotating means 33, the first camera guide rails 41 and the second camera guide rail 51, respectively. Also, a first image discerning unit 62 and a second image discerning unit 63 distinguish image data input by the first cameras 42 and the second cameras 52, respectively. The control unit 60 reads the data of the memory unit 61, carries out necessary computation and controls each of the above-cited driving units.

The equipment for mounting electronic components of this embodiment is constructed as described above.

Figure 7:
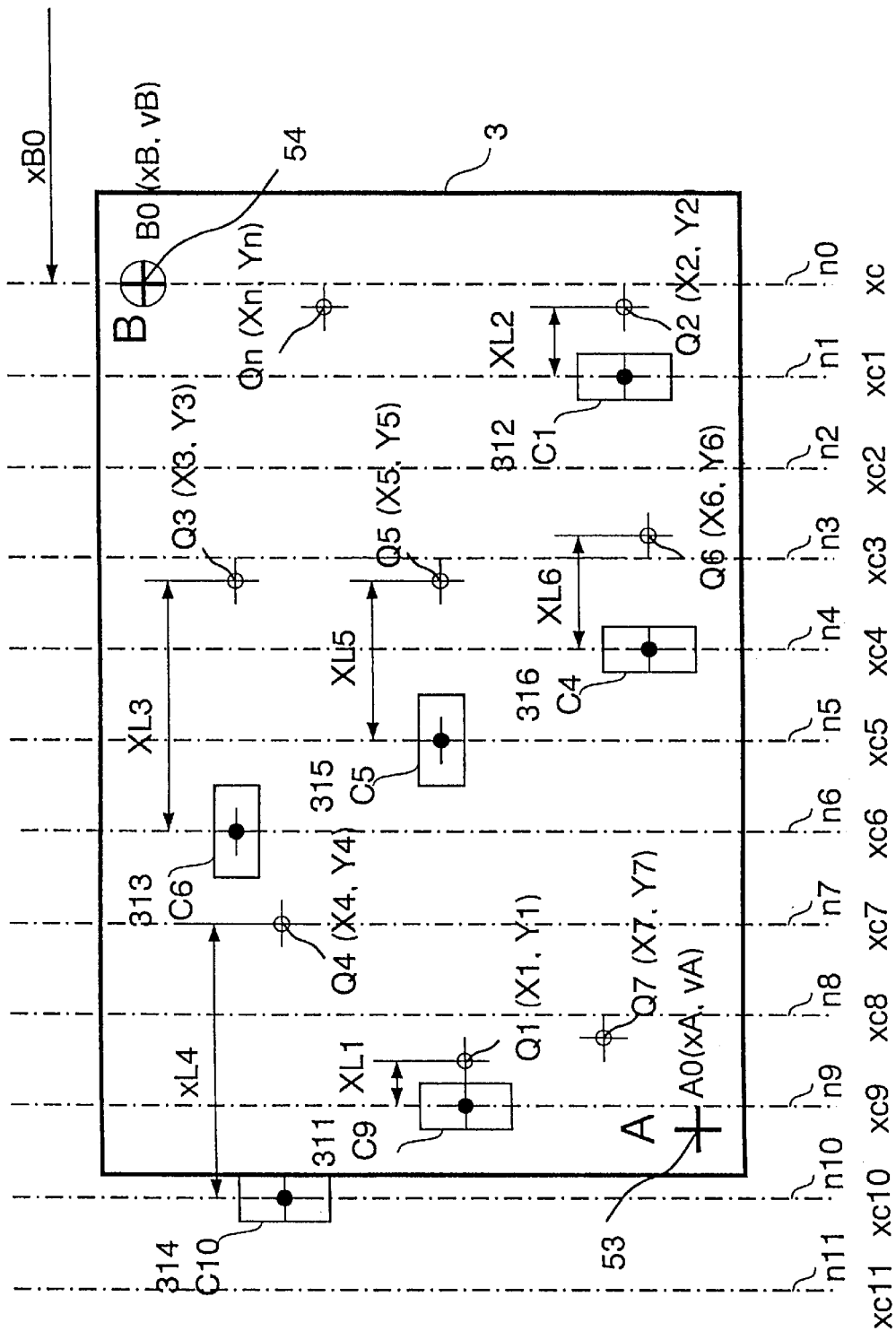
FIG. 7 through FIG. 11 are diagrams depicting positional relationships among nozzles, a substrate and part feeders of the equipment.
Figure 8:
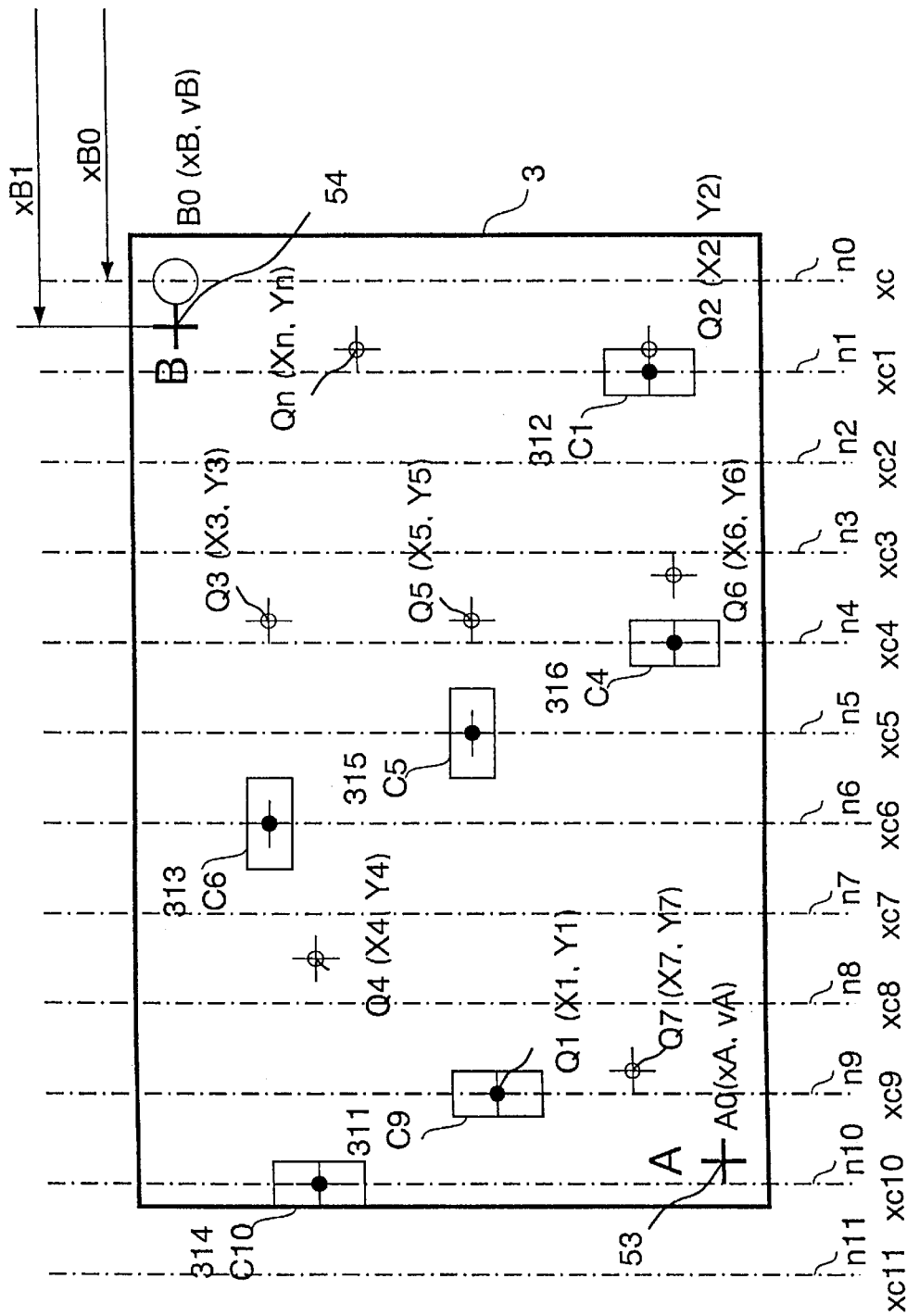

A method of mounting the electronic components is now described with reference to FIG. 7 through FIG. 11 and Table 1. An x, y coordinate system is used for the equipment and an X, Y coordinate system is used on the substrate 3. Table 1 shows an example of the loading data of the electronic components. In Table 1, numerals 1 through n in a first column represent an order of loading the electronic components on the substrate 3, and notations Q1 through Qn in a second column represent loading spots on the substrate onto which the electronic components are loaded, and coordinates of these loading spots are defined by X and Y coordinates in a system of coordinates on the substrate 3 with the B spot 54 as the origin as shown in a third column. Notations C1 through C11 in a fourth column represent kinds of the electronic components, and eleven of them are to be loaded onto the loading spots Q1 through Qn on the substrate in this instance. Mounting positions in a fifth column are X coordinates of the nozzles for part feeders that are equipped with the electronic components C1 through C11; a substrate position in a sixth column is a position of the substrate 3 (a position as shown in FIG. 7) expressed by an X coordinate in the system of coordinates of the equipment when loading of the electronic components begins after recognition of the A spot 53 and the B spot 54 with the second cameras; a magnitude of movement in a seventh column is a distance that the substrate 3 is required to move in the X direction for loading a predetermined electronic component; and a moving time in an eighth column is a time (in seconds) required for moving the magnitude of movement. Next, a method of carrying out the loading data in Table 1 is described.

TABLE 1

| 1 | 2 | 3 | 4 | 5 | 6 | 7 | 8 |
|---|---|---|---|---|---|---|---|
| Loading order | Loading spot | Coordinates of loading spot (B spot being the origin) | Kinds of electronic component | Mounting Position | Substrate position (coordinates system of equipment) | Magnitude of movement | Moving time |
| Discerning | | | | | xB0 | | |
| 1 | Q1 | (X1, Y1) | C9 | XC9 | xB1 = xC9 −X1 | xB1−xB0 | t1 |
| 2 | Q2 | (X2, Y2) | C1 | XC1 | xB2 = xC1 − X2 | xB2−xB1 | t2 |
| 3 | Q3 | (X3, Y3) | C6 | XC6 | xB3 = xC6 − X3 | xB3−xB2 | t3 |
| 4 | Q4 | (X4, Y4) | C10 | xC10 | xB4 = xC10 − X4 | xB4−xB3 | t4 |
| 5 | Q5 | (X5, Y5) | C5 | XC5 | xB5 = xC5−X5 | xB5−xB4 | t5 |
| 6 | Q6 | (X6, Y6) | C11 | xC11 | xB6 = xC11−X6 | xB6−xB5 | t6 |
| 7 | Q7 | (X7, Y7) | C9 | XC9 | xB7 = xC9 − X7 | xB7−xB6 | t7 |
| — | — | — | — | — | — | — | — |
| N | Qn | (Xn, Yn) | C1 | XC1 | xBn = xC1 − Xn | xBn−xB(n − 1) | tn |

Prior to mounting the electronic parts onto the substrate 3, a position of the substrate 3 is verified as follows. In FIG. 1 and FIG. 2, one of the second cameras 52 (in FIG. 2)

discerns the A spot 53 when the A spot 53 reaches below a moving path of the second camera 52 as the substrate 3 is transferred along the moving rail 2.

The other second camera 52 (in FIG. 2) discerns the B spot 54 when the B spot 54 reaches below a moving path of this second camera 52 as the substrate 3 is transferred further. Then the control unit 60 (in FIG. 6) calculates the position of the substrate 3 according to the two discerned results. FIG. 7 illustrates the situation at this moment. Besides, a time in which the substrate 3 is transferred on the moving rail 2 is known in advance on the basis of the program, and therefore, the two second cameras 52 are moved along-the second camera guide rails 51 beforehand to stand by at the positions of the A spot 53 and the B spot 54 on the Y coordinate respectively before the A spot 53 and the B spot 54 reach below the cameras 52. In this way the second cameras 52 are able to catch the A spot 53 and the B spot 54 immediately when they move to the positions on the X coordinate where the cameras are located. In FIGS. 7 through 10, spots shown by A (xA, yA) and B (xB, yB) are coordinate positions of the A spot 53 and the B spot 54, respectively, and spots shown by Q1 (x1, y1), Q2 (x2, y2), Q3 (x3, y3),—Qn (xn, yn) are coordinate positions of individual loading spots, and all of them indicate coordinate positions in the equipment.

As has been described, each of the transfer heads 30 on each of the transfer head guide rails 22 moves to an upper side of the part feeder 11 while the second cameras 52 are discerning the position of the substrate 3. After the nozzles 31 collect (e.g., pick up the electronic components at these spots by vacuum suction, the transfer heads 30 respectively move to the predetermined positions y1, y2, y3—yn on the Y coordinate, and stand by until the substrate 3 is transferred. FIG. 7 illustrates the situation at this moment. The nozzles 31 are identified by notations 311, 312, 313 and so forth in an order of loading the electronic components, and the nozzles 31 marked with black dots are the ones holding the electronic components by the vacuum suction. For example, the nozzle 311 shown by a black dot is the first in loading order, and in standing by state at the loading spot Q1 (x1, y1) while holding an electronic component C9 by the vacuum suction. Likewise, the nozzle 312 shown by another black dot is the second in loading order, and in standby state at the loading spot Q2 (x2, y2) while holding an electronic component C1 by the vacuum suction. Arrow lines identified by XL1, XL2, XL3 and so forth are magnitudes of movement in the X direction required for moving the corresponding loading spots Q1, Q2, Q3 and so forth to positions directly beneath the nozzles 31 that hold the electronic components C by the vacuum suction.

Furthermore, a dashed line n0 in FIG. 7 is a moving line of the second cameras 52 in the Y direction and its coordinate is xc. Dashed lines n1 through n11 are moving lines of the nozzles 31 on the respective transfer heads 30 in the Y direction and their coordinates are xc1, xc2 and so forth. The nozzles 31 (i.e. 311, 312, 313, etc.) move in the Y direction along the moving lines n1 through n11 to pick up the electronic components C1 through C11 from the part feeder 11 arranged on these moving lines n1 through n11, then move toward the loading spots Q1, Q2, Q3, etc. above the substrate 3, stand by, and load them.

In FIG. 7, the substrate 3 is moved forward by a magnitude of movement of XL1 in order to load the electronic component C9, which is held by the nozzle 311 with the vacuum suction, on the predetermined coordinate position of Q1 (x1, y1) at first in the loading order. If a position of the substrate 3 in the X coordinate (in FIG. 7) is designated as xB0 when the second camera 52 has distinguished the B spot 54 prior to the movement of the substrate, and the next position of the substrate 3 in the X coordinate (in FIG. 8) is designated as xB1 after the movement, then XL1 equals to xB1–xB0 (Table 1). The first electronic component C9 is loaded onto the loading spot Q1 (x1, y1) by shifting the nozzle 311 vertically at this position. Here, the magnitude of movement (xB1–xB0) is easily obtainable from a distance between the position of the nozzle 311 and the position of the loading spot Q1, both on the X coordinate.

Figure 9:
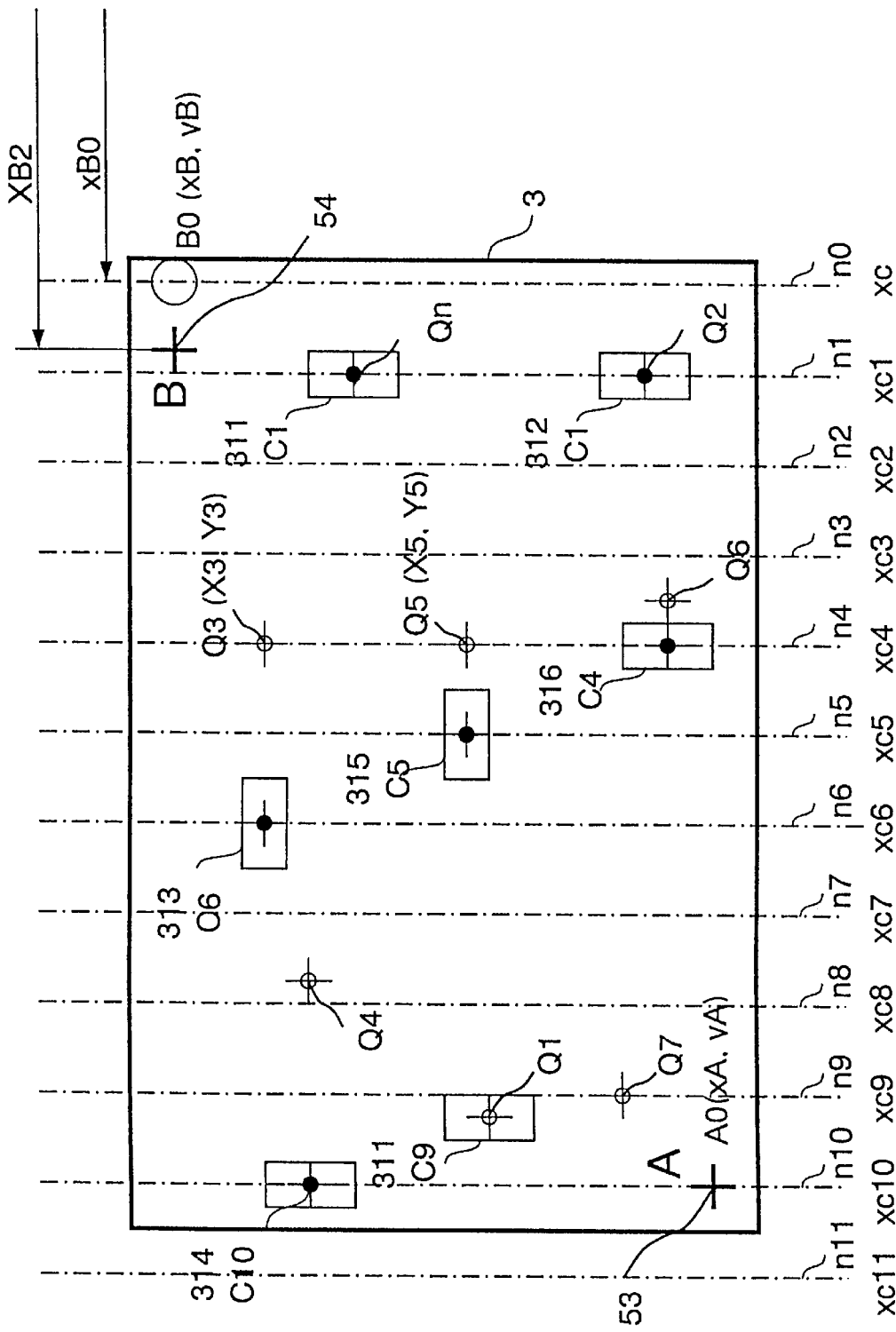
Figure 10:
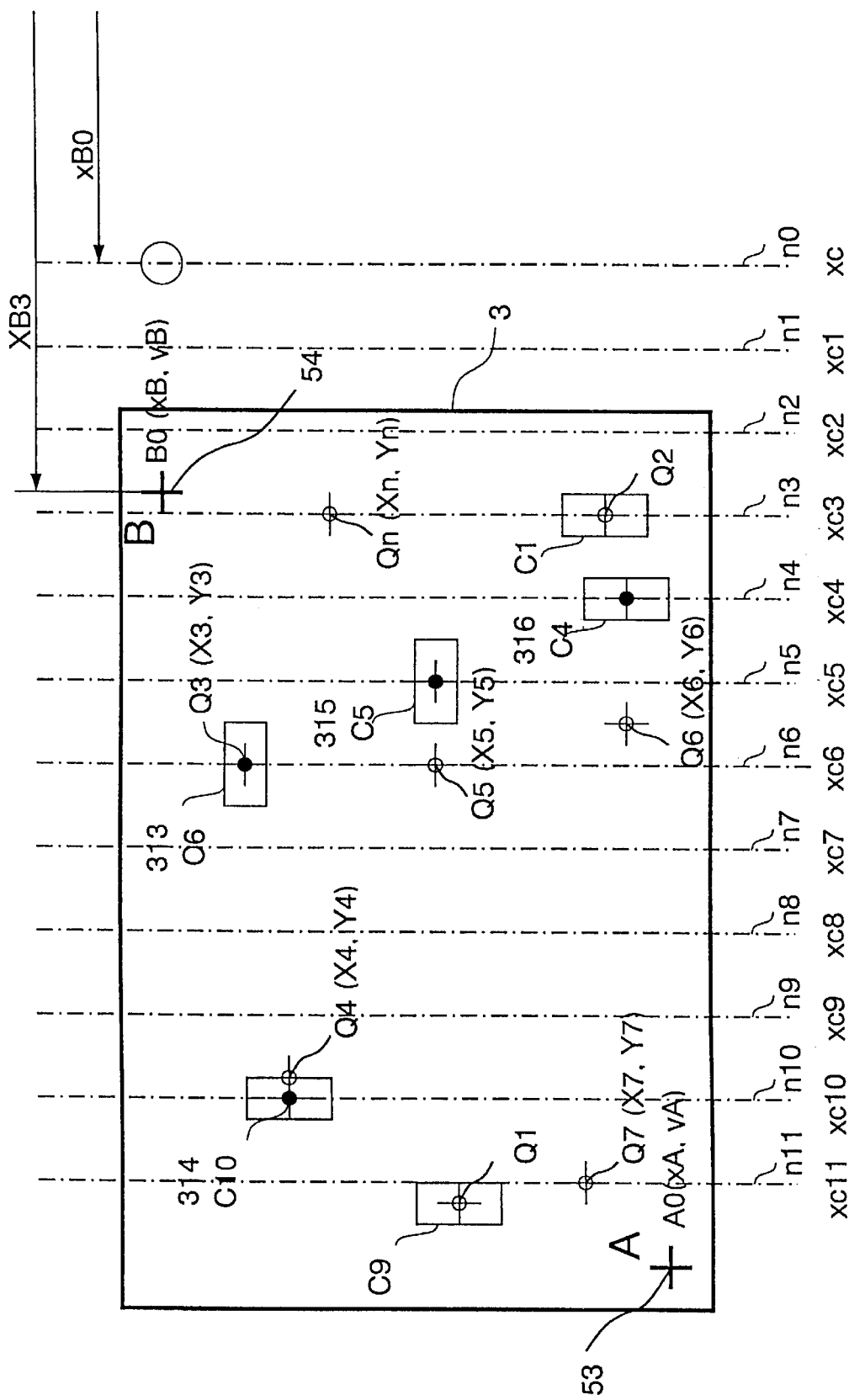
Figure 11:
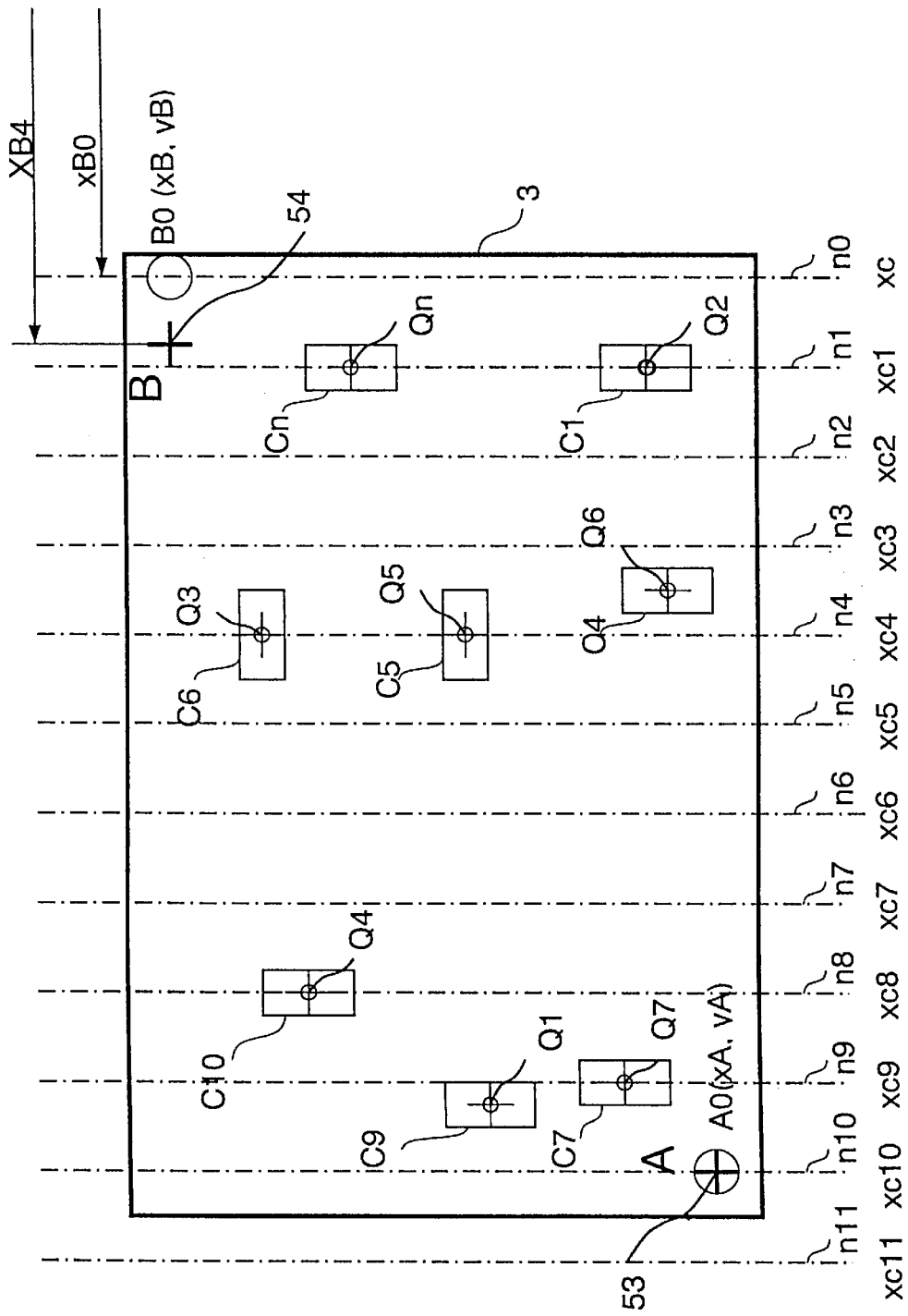

After the first electronic component C9 is loaded onto the loading spot Q1 (x1, y1) as described above, another electronic component C1 held with the vacuum suction by the second nozzle 312 is loaded onto the loading spot Q2 (x2, y2). In this case, since the substrate 3 has already moved from the FIG. 7 position to the position of xB1 in FIG. 8, the loading spot Q2 (x2, y2) moves to a position beneath the second nozzle 312 if the substrate 3 is moved by a magnitude of movement (xB2–xB1) in the X direction. FIG. 9 shows the situation at this moment. The electronic component C1 is then loaded onto the loading spot Q2 by shifting the nozzle 312 vertically at this position.

A third electronic component C6 held by the third nozzle 313 is also loaded onto the loading spot Q3 (in FIG. 10) by moving the substrate 3 in the X direction by a magnitude of movement (xB3–xB2). A fourth and the rest of the electronic components C10, C5, C4 and so forth are also loaded in the same manner onto the loading spots Q4, Q5, Q6, etc. by shifting the nozzles 314, 315, 316, etc. vertically, as loading spots Q4, Q5, Q6 and so forth are moved in consecutive order to positions beneath the nozzles 314, 315, 316, etc. by moving the substrate 3 in the X direction by magnitudes of movement (xB4–xB3), (xB5–xB4), (xB6–xB5), and so forth consecutively.

The loading program for loading the electronic components on the substrate 3 is so determined as to make a sum of the moving times Σt=t1+t2+—tn (in Table 1) as short as possible. Incidentally, the first electronic component C9 and the seventh electronic component C9 are the same kind of component stored in one of the part feeders 11 in this example of Table 1, so that they are transferred and loaded by the same nozzle 311 of one of the loading heads 30. Accordingly, a time margin for the loading heads 30 before loading the seventh electronic component C9 on the substrate 3 after having loaded the first electronic component C9 on the substrate 3 is to be t1+t2+—t7. Therefore, it is preferable for the loading head 30 to pick up the seventh electronic component C9 by the vacuum suction and wait for the substrate 3 within this time margin. Otherwise, a mounting efficiency decreases due to a waiting time for the substrate 3. For this reason, the loading program is determined so as to avoid causing such a waiting time to the extent possible.

On the other hand, there are often cases in which the electronic component held by vacuum suction at the bottom end of the nozzle 31 is slid out of the position in X, Y and θ directions as the nozzle 31 of the transfer head 30 picks up the electronic component of the part feeder 11 and moves toward the predetermined position in the Y coordinate. Therefore, the first camera 42 discerns the electronic component during the movement of the nozzle 31 of the transfer head 30 to the predetermined position in the Y coordinate after the electronic component of the part feeder 11 is picked up, as follows.

In FIG. 1 and FIG. 2, the first camera 42 moves to the underside of the electronic component held by the nozzle 31, and detects any dislocation in the X, Y and θ directions. Then, the dislocation in the X direction is corrected by adjusting the magnitude of movement of the substrate 3 in the X direction, the dislocation in the Y direction is corrected by adjusting the magnitude of movement of the transfer head 30 in the Y direction, and the dislocation in the θ direction is corrected by rotating the nozzle 31 θ degrees with the rotating means 33 (in FIG. 5). Thus, the electronic components are loaded onto the substrate 3 with a high positional accuracy by use of the first camera 42 for discerning the position of the electronic components and correcting the dislocation in the X, Y and θ directions. In this case, the first camera 42 is so operated that discernment of the electronic components does not interrupt the transfer and loading motions of the electronic components by the transfer head 30.

Second Exemplary Embodiment

Figure 12:
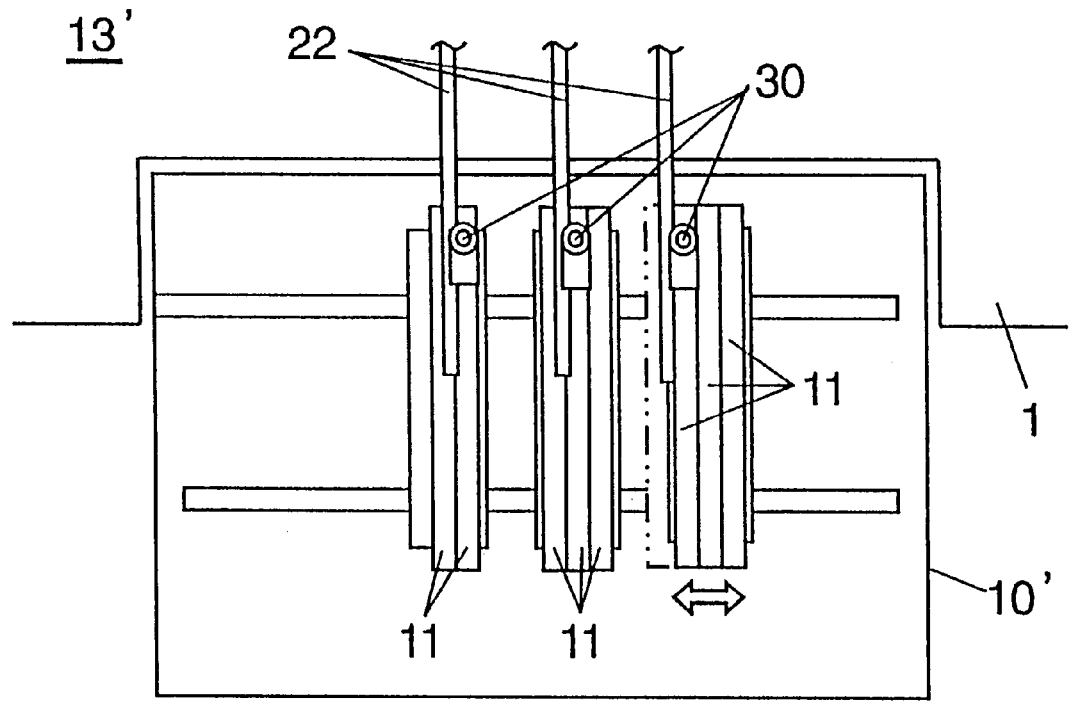
FIG. 12 is a top view of an electronic component supply unit employed in the equipment for mounting electronic components according to a second embodiment of the present invention.
Figure 13:
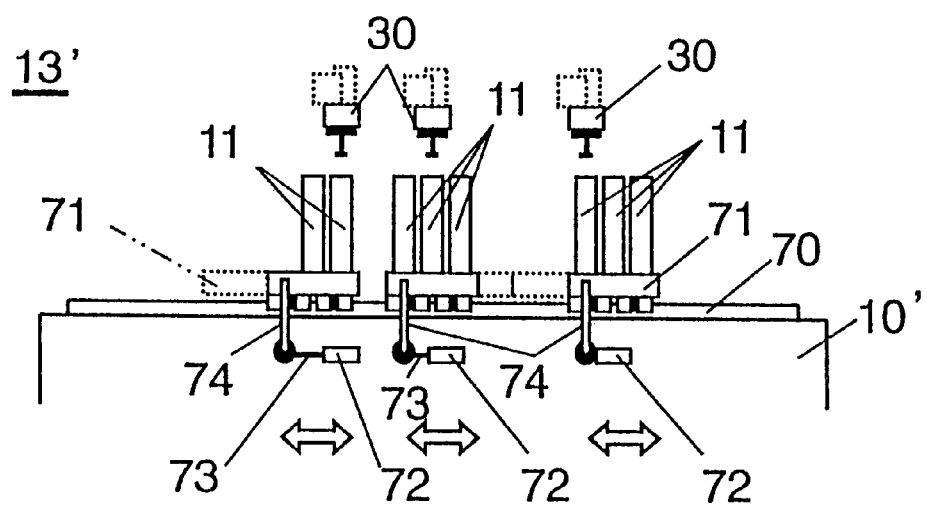
FIG. 13 is a front view of the electronic component supply unit of FIG. 12.

FIG. 12 is a top view of an electronic component supply unit employed in an apparatus for mounting electronic components according to a second embodiment of the present invention, and FIG. 13 is a front view of the same. The electronic component supply unit 13' is provided with two guide rails 70 in parallel on top of the truck 10'. A slider 71 is slidably mounted on the guide rails 70 so as to slide freely. A portion (for example, three or four) the part feeders 11 are placed side by side as one supply unit on the slider 71. An inside of the truck 10' is provided with a fixed cylinder 72 as a moving mechanism with its plunger 73 being connected to the slider 71 via an arm 74. Therefore, as the plunger 73 thrusts in and out, the slider 71 moves along the guide rails 70 and stops so that one of the part feeders 11 on the slider 71 is located at an electronic component pick up position by a transfer head 30.

In this way, a portion of the part feeders provided with the electronic component supply unit composes one unit consisting of a plurality of the part feeders, and by placing this plurality of the part feeders 11 side by side on the slider 71, a supply of intensively consumed electronic components can be increased thereby reducing the frequency at which the part feeders 11 must be replaced due to their running out of the electronic components.

According to the present invention, numerous kinds of electronic components can be loaded consecutively onto predetermined coordinate positions on a substrate at high speed by a simple operation in which the substrate is transferred rectilinearly on a moving rail and transfer heads are moved rectilinearly along a guide rail in a direction orthogonal to the moving direction of the substrate along the moving rail. In addition, a large number of the electronic parts can be loaded on the substrate at high speed, since a plurality of the transfer heads pick up with their nozzles the electronic components from part feeders in a timely manner, stand by in advance at predetermined Y coordinate positions before the substrate reaches such positions, and start operation for loading the electronic components onto predetermined X-Y coordinate spots immediately upon arrival of the substrate at a predetermined position. Moreover, the whole structure is simplified because the transfer heads require only Y direction moving means without necessitating X direction moving means, and the part feeders are fixedly disposed.

What is claimed is:

1. An apparatus for mounting electronic components, comprising:

a base;

a moving-rail track mounted on said base for moving a substrate in a forward direction and backward direction along said moving-rail track;

a plurality of part feeders arranged along said moving-rail track to provide a supply of electronic components;

a plurality of transfer head guide rails connected to said base and arranged along said moving-rail track, each of said transfer head guide rails being aligned orthogonally with respect to said moving-rail track; and at least one transfer head fitted on each of said transfer head guide rails such that each of said transfer heads moves independently along a respective transfer head guide rail, wherein each of said transfer heads is operable to collect one of the electronic components from one of said part feeders, hold and transfer the electronic component to the substrate along said respective transfer head guide rail, and mount the electronic component on the substrate.

2. The apparatus of claim 1, wherein said plurality of part feeders includes at least one supply unit composed of a portion of said plurality of part feeders, and wherein a collection position is defined as a position of said supply unit wherein one of said transfer heads is operable to collect one of the electronic components from one of said part feeders in said at least one supply unit, said apparatus further comprising a moving mechanism connected to said at least one supply unit such that said moving mechanism is operable to move said at least one supply unit into said collection position.

3. The apparatus of claim 2, wherein said moving mechanism comprises a supply unit slider, a fixed cylinder, and a plunger connected between said fixed cylinder and said supply unit slider, said supply unit slider holding said supply unit therein and said plunger being operable to move relative to said fixed cylinder such that said plunger moves said supply unit into said collection position.

4. The apparatus of claim 1, wherein each of said transfer heads comprises a vertical shifting unit for moving said transfer head vertically, a rotating unit for rotating said transfer head about a central transfer head axis, and a driving unit for moving said transfer head along a respective transfer head guide rail.

5. The apparatus of claim 1, wherein each of said transfer heads includes a nozzle for holding the electronic component by vacuum-suction.

6. The apparatus of claim 5, wherein said plurality of part feeders are spaced apart along said moving-rail track at a first pitch, and said plurality of transfer head guide rails are spaced apart along said moving-rail track at a second pitch, said first pitch being equal to said second pitch.

7. The apparatus of claim 6, further comprising a first camera on said upper surface of said base between said moving-rail track and said part feeders, said first camera being operable to discern a location of the electronic component being held by said nozzle of one of said transfer heads, and further comprising a first camera moving mechanism for moving said first camera parallel to said moving-rail track.

8. The apparatus of claim 6, further comprising a first camera guide rail mounted on said upper surface of said base between said moving-rail track and said part feeders and aligned parallel to said moving-rail track, and a first camera movably mounted on said first camera guide rail such that said first camera is operable to move along said first camera guide rail for, discerning a location of the electronic component being held by said nozzle of one of said transfer heads.

9. The apparatus of claim 8, further comprising a second camera guide rail connected to said base and aligned parallel to said transfer head guide rails, and a pair of second cameras movably mounted on said second camera guide rail such that said pair of second cameras are operable to move along said second camera guide rail for discerning a position of the substrate.

10. The apparatus of claim 8, further comprising a pair of second cameras movably connected to said base, said pair of second cameras being operable to discern a position of the substrate by detecting positional identification marks provided at two locations on the substrate.

11. The apparatus of claim 1, further comprising a first camera on said upper surface of said base between said moving-rail track and said part feeders, said first camera being operable to discern a location of the electronic component being held by one of said transfer heads, and further comprising a first camera moving mechanism for moving said first camera parallel to said moving-rail track.

12. The apparatus of claim 1, further comprising a first camera guide rail mounted on said upper surface of said base between said moving-rail track and said part feeders and aligned parallel to said moving-rail track, and a first camera movably mounted on said first camera guide rail such that said first camera is operable to move along said first camera guide rail for discerning a location of the electronic component being held by one of said transfer heads.

13. The apparatus of claim 12, further comprising a second camera guide rail connected to said base and aligned parallel to said transfer head guide rails, and a pair of second cameras movably mounted on said second camera guide rail such that said pair of second cameras are operable to move along said second camera guide rail for discerning a position of the substrate.

14. The apparatus of claim 12, further comprising a pair of second cameras movably connected to said base, said pair of second cameras being operable to discern a position of the substrate by detecting positional identification marks provided at two locations on the substrate.

15. A method of mounting electronic components, comprising:
  picking up electronic components from a plurality of part feeders arranged along a moving-rail track by using at least one transfer head, the at least one transfer head having a nozzle for holding the electronic components, the at least one transfer head being fitted on a respective transfer head guide rail;
  transferring the electronic components to a substrate moving along the moving-rail track by moving the at least one transfer head along the transfer head guide rail;
  mounting the electronic components on the substrate, wherein said mounting of each electronic component comprises determining an X-axis mounting position for mounting the electronic component based upon an amount of movement of the substrate on the moving-rail track, and determining a Y-axis mounting position for mounting the electronic component based upon an amount of movement of the at least one transfer head along the transfer head guide rail;
  moving the substrate forwards and backwards on the X-axis along the moving-rail track;
  discerning a Y-axis position of one of the electronic components by using a first camera movably mounted on a first camera guide rail, the first camera guide rail being arranged parallel to the moving-rail track and between the moving-rail track and the plurality of part feeders;
  discerning an X-axis position of the substrate moved along the moving-rail track by using a second camera mounted on a second camera guide rail, the second camera guide rail being arranged parallel to the transfer head guide rail;
  wherein said mounting of each electronic component further comprises determining the X-axis mounting position and the Y-axis mounting position based upon said discerning of the Y-axis position of one of the electronic components and said discerning of the X-axis position of the substrate; and
  wherein the transfer head guide rail is aligned orthogonally with respect to the moving-rail track such that said transferring of the electronic components along the transfer head guide rail comprises moving the transfer heads along the Y-axis.

16. A method of mounting electronic components, comprising:
  picking up electronic components from a plurality of part feeders arranged along a moving-rail track by using at least one transfer head, the at least one transfer head having a nozzle for holding the electronic components, the at least one transfer head being fitted on a respective transfer head guide
  transferring the electronic components to a substrate moving along the moving-rail track by moving the at least one transfer head along the transfer head guide rail;
  mounting the electronic components on the substrate, wherein said mounting of each electronic component comprises determining an X-axis mounting position for mounting the electronic component based upon an amount of movement of the substrate on the moving-rail track, and determining a Y-axis mounting position for mounting the electronic component based upon an amount of movement of the at least one transfer head along the transfer head guide rail;
  observing one of the electronic components using a camera for detecting a dislocation of the electronic component, the camera being movable along a first line while one of the electronic components is transferred by a transfer head moving on the transfer head guide rail along a second line, wherein the first line is orthogonal with respect to the second line; and
  correcting the dislocation of the electronic component along the X-axis by adjusting the amount of movement of the substrate, and correcting the dislocation of the electronic component along the Y-axis by adjusting the amount of movement of the transfer head transferring the electronic component.

17. The method of claim 16, wherein said transferring of the electronic component comprises moving the transfer head holding an electronic component along the Y-axis to a Y-axis mounting position before an X-axis mounting position on the substrate is positioned below the electronic component held by the transfer head; and
  wherein said mounting of the electronic component comprises vertically moving the nozzle of the transfer head holding an electronic component when the X-axis mounting position on the substrate is positioned below the electronic component held by the transfer head.

* * * * *